(12) United States Patent
Higuchi et al.

(10) Patent No.: US 6,207,296 B1
(45) Date of Patent: Mar. 27, 2001

(54) INORGANIC FILLER, EPOXY RESIN COMPOSITION, AND SEMICONDUCTOR DEVICE

(75) Inventors: Noriaki Higuchi; Takaaki Fukumoto, both of Chiyoda-ku; Toshio Shiobara, Usui-gun; Eiichi Asano, Usui-gun; Kazutoshi Tomiyoshi, Usui-gun, all of (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/326,588

(22) Filed: Jun. 7, 1999

Related U.S. Application Data

(62) Division of application No. 08/919,344, filed on Aug. 28, 1997.

(30) Foreign Application Priority Data

Aug. 29, 1996 (JP) .................................................. 8-247025

(51) Int. Cl.[7] ........................................................ H01L 29/12
(52) U.S. Cl. ........................... 428/620; 523/440; 523/443
(58) Field of Search ............................ 428/620; 523/440, 523/443

(56) References Cited

U.S. PATENT DOCUMENTS

| | | |
|---|---|---|
| 3,862,090 | 1/1975 | Goldberg . |
| 5,137,940 | 8/1992 | Tomiyoshi et al. . |
| 5,166,228 | 11/1992 | Shiobara et al. . |
| 5,418,265 | 5/1995 | Matsuzaki et al. . |
| 5,605,985 | 2/1997 | Rademacher et al. . |
| 5,630,554 | 5/1997 | Izumikawa et al. . |

FOREIGN PATENT DOCUMENTS

| | | |
|---|---|---|
| 0 827 159 A2 | 3/1998 | (EP) . |
| 0 827 159 A3 | 4/1998 | (EP) . |
| 62-243630 | 10/1987 | (JP) . |

OTHER PUBLICATIONS

Abstract, JP 03 177450 A (Hitachi Chem Co Ltd), Aug. 1, 1991.
European Search Report, Oct. 1, 1998.

Primary Examiner—Robert Dawson
Assistant Examiner—D. Aylward
(74) Attorney, Agent, or Firm—Millen, White, Zelano & Branigan, P.C.

(57) ABSTRACT

By removing a fraction of fine particles having a particle size of less than 2 $\mu$m from starting inorganic filler particles having a mean particle size of 10–50 mm and adding thereto particles having a mean particle size of 0.1–2 $\mu$m and a specific surface area of 3–10 $m^2$/g (BET), there is obtained a particulate inorganic filler having a mean particle size of 5–40 $\mu$m. When a large amount of the inorganic filler is loaded in an epoxy resin composition, the composition maintains a low melt viscosity enough to mold and is effective for encapsulating a semiconductor device without causing die pad deformation and wire deformation. The encapsulated semiconductor device is highly reliable.

6 Claims, No Drawings

INORGANIC FILLER, EPOXY RESIN COMPOSITION, AND SEMICONDUCTOR DEVICE

This is a divisional of application Ser. No. 08/919,344 filed Aug. 28, 1997 now allowed.

BACKGROUND OF THE INVENTION

1. Field of the Invention

This invention relates to a novel inorganic filler which can be highly loaded in resin compositions, typically epoxy resin compositions without increasing viscosity, thus providing resin compositions having a low melt viscosity enough to mold. It also relates to an epoxy resin composition loaded with the inorganic filler and a semiconductor device encapsulated with a cured product of the composition.

2. Prior Art

Prior art epoxy resin compositions used for the encapsulation of semiconductor devices generally contain less than 80% by weight of an inorganic filler. To improve the reflow soldering resistance, it becomes a recent mainstream technique that a low viscosity resin is as a main component and a large amount of an inorganic filler is blended in the resin to reduce a percent water absorption. When such highly loaded resin compositions having a very low content of the resin component are produced by conventional well-known continuous kneaders, the resulting compositions have a high viscosity and poor moldability because the wetting of the filler with the resin is insufficient.

In this regard, we found that a substantial drop of moldability occurs when the inorganic filler used contains a large proportion of a filler component having a specific surface area in excess of 10 m²/g and a particle size of less than 2 μm, especially less than 0.5 μm. Also, when a filler is produced by a conventional method, the content of submicron particles (having a particle size of less than 1 μm) somewhat varies between lots. Then moldability depends on a particular lot of filler. Such inconvenient problems can be overcome by redesigning the screw of the continuous kneader or extending the kneading time. Unfortunately, these approaches are low in productivity and add to the cost.

It is thus desired to overcome the problems associated with high loadings of inorganic filler.

SUMMARY OF THE INVENTION

An object of the invention is to provide an inorganic filler which can be highly loaded in resin compositions while maintaining a low melt viscosity enough to mold. Another object of the invention is to provide an epoxy resin composition loaded with the inorganic filler. A further object of the invention is to provide a semiconductor device encapsulated with the epoxy resin composition.

We have found that by removing a fraction of fine particles having a particle size of less than 2 μm from starting inorganic filler particles as by classification or wet sieving and thereafter adding fine particles having a controlled particle size, particle size distribution and specific surface area, there is obtained a particulate inorganic filler which can be blended with a liquid or solid powder resin, typically epoxy resin to form a resin composition having stable flow properties and improved moldability.

More particularly, the flow properties of an encapsulating resin composition largely affect the molding of modern thin packages and multi-pin large-size packages. For resin compositions serving as an encapsulant, the current approach taken in order to find a compromise between filling improvement and low water absorption is to blend a spherical filler containing a large proportion of a submicron filler component having a mean particle size of less than 1 μm, desirably less than 0.5 μm. Such a spherical filler is generally manufactured by pulverizing silica stone into a fine powder and melting the powder in a flame into spherical particles. With this method, it is difficult to control the content of a fine spherical filler fraction having a mean particle size of less than 2 μm, especially less than 0.5 μm, and that content often varies between different lots. Also a subtle change of manufacturing conditions results in a change of the particle size distribution of a fine spherical filler fraction of less than 2 μm. A variation of such a fine filler fraction can largely affect the flow and mold properties of an epoxy resin composition loaded therewith. To achieve an improvement under such circumstances, we have found that a unique inorganic filler is obtained by removing a fraction of fine particles having a particle size of less than 2 μm and having a greater specific surface area from starting inorganic filler particles and adding thereto controlled fine particles having a mean particle size of 0.1 to 2 μm and a specific surface area of 3 to 10 m²/g. Using this particulate inorganic filler, a resin composition, typically an epoxy resin composition free of the above-mentioned problems is obtained.

According to a first aspect of the invention, there is provided a particulate inorganic filler having a mean particle size of 5 to 40 μm, which is obtained by removing a fraction of fine particles having a particle size of less than 2 μm from inorganic filler particles having a mean particle size of 10 to 50 μm and adding thereto particles having a mean particle size of 0.1 to 2 μm and a specific surface area of 3 to 10 m²/g as measured by a nitrogen adsorption BET method. Preferably, 1 to 30 parts by weight of the particles having a mean particle size of 0.1 to 2 μm and a specific surface area of 3 to 10 m²/g is added to 100 parts by weight of the inorganic filler particles from which the fine particle fraction has been removed.

In a second aspect, the invention provides an epoxy resin composition comprising an epoxy resin, a curing agent, and an inorganic filler which is as defined above.

Also contemplated herein is a semiconductor device encapsulated with a cured product of an epoxy resin composition as defined above.

DETAILED DESCRIPTION OF THE INVENTION

Briefly stated, the particulate inorganic filler according to the invention is obtained by removing fine particles having a particle size of less than 2 μm from starting inorganic filler particles and adding instead particles having a mean particle size of 0.1 to 2 μm and a specific surface area of 3 to 10 m²/g.

The starting inorganic filler should have a mean particle size of 10 to 50 μm, preferably 15 to 40 μm. If the mean particle size is less than 10 μm, which means that the filler has a too small particle size, an epoxy resin composition loaded with a large proportion of the filler would become too viscous to mold. If the mean particle size is more than 50 μm, a cured product would become low in strength. The starting inorganic filler contains fine particles having a particle size of less than 2 μm. The starting inorganic filler containing 0.5 to 25% by weight, especially 0.5 to 15% by weight of fine particles having a particle size of less than 2 μm is convenient because the removal of the fine particles is easy and inexpensive. Further, the starting inorganic filler should preferably have a specific surface area of 0.5 to 4 m²/g, especially 0.5 to 3 m²/g as measured by a nitrogen adsorption BET method

In the first step of the invention, a fraction of fine particles having a particle size of less than 2 μm originally contained in the starting inorganic filler is removed.

The fine particles can be removed by passing the starting filler through a classifier such as a cyclone or a wet screen during preparation of the filler. The particles to be removed are fine particles having a particle size of less than 2 μm, especially less than 0.1 μm and a specific surface area of more than 50 m²/g. The content of fine particles in the starting inorganic filler varies between different lots of the filler manufacture. A slight variation of the fine particle content can largely affect the molding properties because the fine particles have a greater specific surface area. Therefore, in order to provide stable molding properties, it is very important to control the content of such fine particles.

In the second step of the invention, controlled fine particles are added to the inorganic filler from which the fraction of fine particles having a particle size of less than 2 μm has been removed, thereby yielding a particulate inorganic filler which can be highly loaded in a resin composition to provide the composition with stable molding properties.

The controlled fine particles should have a mean particle size of 0.1 to 2 μm, preferably 0.3 to 2 μm, more preferably 0.5 to 1.5 μm and a specific surface area of 3 to 10 m²/g, preferably 4 to 7 m²/g as measured by a nitrogen adsorption BET method. Such controlled fine particles are commercially available as spherical silica and alumina fillers having a mean particle size of 0.3 to 2 μm and a specific surface area of 3 to 10 m²/g, for example, under the trade names of SO25 and SO32 from Admatechs K.K. Also useful are spherical fine particles which can be prepared by a sol-gel method and have similar characteristics. One exemplary filler to be added can be prepared by a method of burning metallic silica in a flame for oxidation. This method ensures that the particle size distribution and specific surface area are readily controlled.

The addition of the controlled fine particles results in a particulate inorganic filler having a mean particle size of 5 to 40 μm, especially 10 to 35 μm. If the mean particle size is less than 5 μm, such a filler would increase the viscosity of a resin composition loaded therewith so that the filler cannot be added in a large proportion. A mean particle size of more than 40 μm indicates a larger proportion of coarse particles which can cause gate clogging. The inorganic filler should preferably have a maximum particle size of less than 74 μm, especially less than 50 μm.

Accordingly, the controlled fine particles having a mean particle size of 0.1 to 2 μm and a specific surface area of 3 to 10 m²/g is added to the inorganic filler particles (from which the original fine particles of less than 2 μm in size have been removed) in such an amount that the resulting inorganic filler may have a mean particle size in the above-defined range. Preferably, 1 to 30 parts, especially 5 to 25 parts by weight of the controlled fine particles is added to 100 parts by weight of the inorganic filler particles from which the original fine particles have been removed. If the amount of the controlled fine particles is less than 1 part on this basis, the amount of fine powder is too small so that moldability might be exacerbated and burrs and flashes are likely to occur. If the amount of the controlled fine particles is more than 30 parts, the amount of fine powder is too large so that the resin composition might have a too high viscosity.

It is preferred from the standpoints of low viscosity and moldability that the inorganic filler of the invention have a specific surface area of 0.5 to 3 m²/g, more preferably 0.7 to 2 m²/g as measured by a nitrogen adsorption BET method because a resin composition loaded therewith is not so thixotropic.

The inorganic filler of the invention is substantially free of a fine particle fraction having a particle size of less than 0.1 μm that largely affects flow properties. Differently stated, the inorganic filler of the invention has a relatively narrow particle size distribution.

It is noted that the mean particle size and particle size distribution are measurements (e.g., weight average values) by a laser diffraction particle size distribution meter, for example, Granulometer 920 by CILAS ALCATEL (France).

The type of the inorganic filler according to the invention is not critical and may be properly selected depending on the intended application. For example, fused silica, crystalline silica, alumina, boron nitride, aluminum nitride, silicon nitride, magnesia, and magnesium silicate may be used. Where semiconductor elements produce a considerable heat release, it is desirable to use fillers having a greater thermal conductivity and a lower coefficient of expansion such as alumina, boron nitride, aluminum nitride and silicon nitride. They may be blended with fused silica. The shape of the inorganic filler is not critical. Fillers of flake, dendrite and spherical shapes may be used alone or in admixture of two or more. Preferably the filler is surface treated with silane coupling agents and titanium coupling agents prior to use.

The inorganic filler of the invention may be blended in various resin compositions, for example, epoxy resin compositions, silicone resin compositions, and phenol resin compositions, especially in epoxy resin compositions for the encapsulation of semiconductor devices.

Now this application of the inorganic filler is described. The epoxy resin composition according to the invention contains an epoxy resin, a curing agent, and an inorganic filler as essential components.

The epoxy resin used herein may be selected from prior art well-known epoxy resins having at least two epoxy groups in a molecule, for example, bisphenol A type epoxy resins, bisphenol F type epoxy resins, phenol novolak type epoxy resins, cresol novolak type epoxy resins, naphthalene type epoxy resins, biphenyl type epoxy resins, phenol aralkyl type epoxy resins, and cyclopentadiene type epoxy resins. Preferred of these epoxy resins are naphthalene type epoxy resins, biphenyl type epoxy resins, and epoxy resins having a liquid crystal structure represented by either of the following structural formulae.

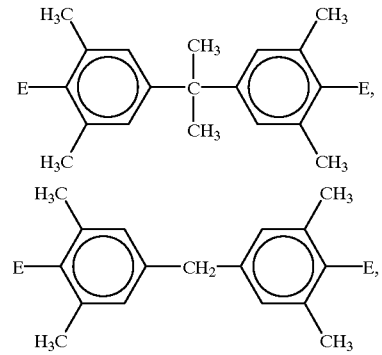

-continued

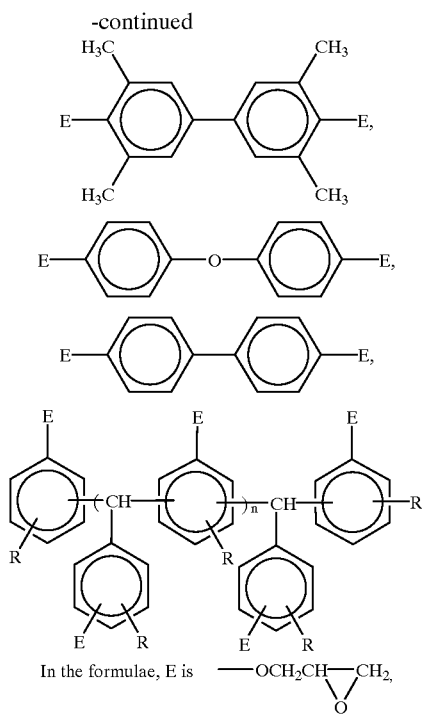

In the formulae, E is —OCH$_2$CH—CH$_2$,
\O/

R is hydrogen or an alkyl group having 1 to 4 carbon atoms, such as methyl, ethyl, propyl, isopropyl, butyl, isobutyl and tert-butyl, and letter n is an integer of 0 to 5.

These epoxy resins should preferably have an overall chlorine content of less than 1,500 ppm, more preferably less than 1,000 ppm, and a water extractable chlorine content of less than 5 ppm as measured in an epoxy resin concentration of 50% by weight at 120° C. for 20 hours. If the overall chlorine content is more than 1,500 ppm and/or the water extractable chlorine content is more than 5 ppm, semiconductor devices encapsulated with such epoxy resins would become less reliable against humidity.

The curing agent may be selected from conventional well-known compounds used as a curing agent for epoxy resins, for example, phenol compounds, amine compounds and acid anhydride compounds. In particular, phenol resins having at least two phenolic hydroxyl groups in a molecule are useful. Exemplary phenol resins are phenol novolak resins, cresol novolak resins, phenol aralkyl resins, naphthalene type phenol resins, cyclopentadiene type phenol resins, and phenolic hydroxyl group-containing phenol resins of the following structure:

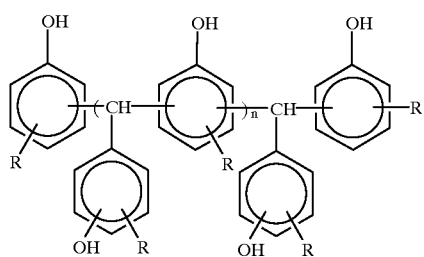

wherein R is hydrogen or an alkyl group having 1 to 4 carbon atoms, such as methyl, ethyl, propyl, isopropyl, butyl, isobutyl and tert-butyl, and letter n is an integer of 0 to 5.

Like the epoxy resins, the phenol resins should preferably have chloride and sodium ion contents of less than 10 ppm, especially less than 5 ppm when extracted at 120° C.

The epoxy resin and the phenol resin are preferably mixed such that 0.5 to 1.6 mol, especially 0.6 to 1.4 mol of the phenolic hydroxyl group is available per mol of the epoxy group. Less than 0.5 mol of the phenolic hydroxyl group per mol of the epoxy group means a shortage of hydroxyl groups, which can lead to a greater proportion of homopolymerization of epoxy groups and hence, a lower glass transition temperature. More than 1.6 mol of the phenolic hydroxyl group per mol of the epoxy group means a higher proportion of phenolic hydroxyl groups, which can lead to a lower reactivity, a lower crosslinking density and an insufficient strength.

In the epoxy resin composition of the invention, a curing promoter may be blended. The curing promoter may be selected from phosphorus compounds, imidazole derivatives, and cycloamidine derivatives. The amount of the curing promoter is preferably 0.01 to 10 parts by weight per 100 parts by weight of the epoxy resin and the phenol resin combined.

The filler used in the epoxy resin composition of the invention is the particulate inorganic filler defined above according to the invention. The amount of the inorganic filler blended is preferably about 70 to 90%, especially about 80 to 90% by weight of the entire composition. Differently stated, about 250 to 900 parts by weight of the inorganic filler is blended per 100 parts by weight of the epoxy resin and the curing agent combined. Outside this range, epoxy resin compositions with less amounts of the inorganic filler would have a relatively high coefficient of expansion and a high water absorption, leaving the risk that packages crack at high temperature upon reflow soldering in mounting on substrates. Epoxy resin compositions with more amounts of the inorganic filler would become too viscous to mold. Desirably about 500 to 850 parts by weight of the inorganic filler is blended per 100 parts by weight of the epoxy resin and the curing agent combined.

For imparting thixotropy, ultrafine silica such as aerosil may be added to the epoxy resin composition.

Further, conventional well-known powders such as silicone rubber and gel, silicone-modified epoxy resins, silicone-modified phenol resins, and thermoplastic resins such as methyl methacrylate-butadiene-styrene copolymers may be blended in the epoxy resin composition as a stress reducing agent.

Also conventional well-known diluents having an epoxy or phenolic hydroxyl group may be added for reducing viscosity. Exemplary diluents include n-butyl glycidyl ether, phenyl glycidyl ether, styrene oxide, tert-butyl-phenyl glycidyl ether, dicyclopentadiene diepoxide, phenol, cresol, and tert-butylphenol.

Still further, coupling agents such as silane coupling agents, titanium coupling agents, and aluminum coupling agents, pigments such as carbon black, and wettability modifiers and antifoaming agents such as nonionic surfactants, fluorinated surfactants and silicone fluids are added if desired.

With respect to the manufacturing process, a liquid epoxy resin composition may be prepared by fully kneading the above-mentioned ingredients in an agitating mixer such as a Shinagawa mixer. The kneading temperature is desirably 20 to 50° C. A powder epoxy resin composition may be prepared by uniformly mixing the above-mentioned ingredients in a high speed mixer and fully kneading the mixture in a twin-roll mill or continuous kneader. The kneading temperature is desirably 50 to 110° C. After kneading, the composition is thinly sheeted, cooled, and pulverized.

The resin composition of the invention is used as a general purpose molding material, especially semiconductor encapsulating material. The molding technique used herein includes transfer molding, potting, and underfilling for clip chip mounting. The curing temperature for transfer molding is 150 to 180° C. The curing temperature for potting and underfilling is 80 to 170° C., with step curing at temperatures of about 100° C. and about 150° C. being desirable.

Various semiconductor devices can be encapsulated with the epoxy resin composition according to the invention. Inter alia, discrete devices, IC, and high integration devices such as LSI and ultra-LSI can be advantageously encapsulated.

There has been described a particulate inorganic filler which can be highly loaded in resin compositions, typically epoxy resin compositions so that the resin compositions may have a low melt viscosity enough to mold. An epoxy resin composition loaded with the inorganic filler is effective for encapsulating a semiconductor device without causing die pad deformation and wire deformation. The semiconductor device encapsulated with the loaded epoxy resin composition thus remains highly reliable.

EXAMPLE

Examples of the present invention are given below by way of illustration and not by way of limitation. All parts are by weight.

Example 1

Preparation of Silica

Spherical silica having a mean particle size of 30.2 $\mu$m and a specific surface area of 1.7 m$^2$/g was subject to wet classification with water, whereby a fine powdery silica fraction was removed. Spherical silica (A) having a mean particle size of 32.1 $\mu$m and a specific surface area of 0.8 m$^2$/g was obtained in a yield of 94% by weight. This means that the starting spherical silica having a mean particle size of 30.2 $\mu$m contained 6% by weight of particles having a particle size of 2 $\mu$m or less. The fine powdery silica fraction (B) removed had a mean particle size of 1.5 $\mu$m and a specific surface area of 15 m$^2$/g. Fine spherical silica as shown below, 6% by weight, was added to the spherical silica (A), obtaining a spherical silica sample. For comparison purposes, a spherical silica sample was also prepared by adding 6% by weight of the fine powdery silica fraction (B) to the spherical silica (A) again. The characteristics of the thus obtained silica samples were shown in Table 1.

Fine spherical silica:

| Trade name | Specific surface area (m$^2$/g) | Mean particle size ($\mu$m) |
| --- | --- | --- |
| SO25R | 6.9 | 0.5 |
| SO25H | 4.8 | 0.6 |
| SO32R | 3.4 | 1.7 |
| SOC1 | 26.2 | 0.2 | all available from Admatechs K.K.

TABLE 1

| Spherical silica A (%) | SO25R (%) | SO25H (%) | SO32R (%) | SOC1 (%) | Fine powdery silica B (%) | Mean particle size ($\mu$m) | Specific surface area (m$^2$/g) | Silica sample No. | |
| --- | --- | --- | --- | --- | --- | --- | --- | --- | --- |
| 94 | 6 | — | — | — | — | 30.2 | 1.1 | 1 | Example |
| 94 | — | 6 | — | — | — | 30.1 | 1.0 | 2 | Example |
| 94 | — | — | 6 | — | — | 30.3 | 0.9 | 3 | Example |
| 94 | — | — | — | 6 | — | 30.2 | 2.3 | 4 | Comparative Example |
| 94 | — | — | — | — | 6 | 29.5 | 1.7 | 5 | Comparative Example |
| 90 | — | 10 | — | — | — | 29.0 | 1.2 | 6 | Example |
| 92 | — | 4 | — | — | 4 | 28.3 | 1.5 | 7 | Comparative Example |

Examples 2–5 & Comparative Examples 1–3

Epoxy resin compositions were prepared by weighing 300 grams of each of seven silica samples prepared in Example 1 and the starting silica prior to classification, 100 grams of an epoxy resin Epikote 807 (bisphenol F type epoxy resin having an epoxy equivalent of 168 and a viscosity of 38 poises at 25° C., by Shell Chemical Co.), and 1.2 grams of 2-phenylimidazole as a curing agent, and fully kneading them at 30° C. under a vacuum for 30 minutes. At the end of kneading, the compositions were measured for viscosity by an E type viscometer at a shear rate of 0.6 s$^{-1}$ and 10 s$^{-1}$ and a temperature of 25° C. The results are shown in Table 2.

Each of the epoxy resin compositions was potted at 80° C. on a plastic leaded chip carrier (PLCC) having 450 gold wires connected and cured at 110° C. for 1 hour and at 150° C. for a further 4 hours. The encapsulation of PLCC was evaluated by examining the presence or absence of internal voids by a ultrasonic flaw detector. It is evident from the results that epoxy resin compositions loaded with the fillers of the invention causing a less viscosity difference between shear rates of 0.6 s$^{-1}$ and 10 s$^{-1}$ accomplish more effective encapsulation.

TABLE 2

| | Silica sample No. | Viscosity @ 0.6 s$^{-1}$ (mPa.s) | Viscosity @ 10 s$^{-1}$ (mPa.s) | Encapsulation, internal voids |
|---|---|---|---|---|
| E2 | 1 | 275000 | 164000 | none |
| E3 | 2 | 220000 | 161000 | none |
| E4 | 3 | 300000 | 117000 | none |
| E5 | 6 | 230000 | 102000 | none |
| CE1 | 4 | 415000 | 163000 | present |
| CE2 | 5 | 457000 | 216000 | present |
| CE3 | 7 | 405000 | 206000 | present |

Examples 6–8 & Comparative Examples 4–5

Epoxy resin compositions were prepared by weighing 42.6 grams of a biphenyl type epoxy resin YX4000HK (Yuka Shell K.K.), 46.8 grams of a phenol aralkyl resin Mylex-3L (Mitsui Toatsu Chemical K.K.), 6 grams of antimony trioxide, 4.2 grams of a brominated novolac epoxy resin BREN-S (Nihon Kayaku K.K.), 2.6 grams of carnauba wax, 1.3 grams of triphenylphosphine, and the indicated amount (see Table 3) of silica sample No. 1, 2, 4 or 5 and mixing the ingredients in a Henschel mixer. The mixtures were further kneaded in a continuous kneader. The compositions were examined by the following tests.

Loading

The amount (in parts) of the filler per 100 parts of the epoxy resin and the curing agent combined.

Spiral Flow

A spiral flow was measured by transfer molding an epoxy resin composition at a temperature of 175° C. and a pressure of 70 kg/cm$^2$.

Gel Time

An epoxy resin composition was heated on a hot plate at 175° C. until the composition gelled.

Melt Viscosity

Using a Kouka type flow tester with a nozzle having a diameter of 1 mm, a viscosity was measured at a temperature of 175° C. and a pressure of 10 kg.

Internal and External Voids

An epoxy resin composition was transfer molded over a quad flat package (QFP, five samples) at a temperature of 175° C. and a pressure of 70 kgf/cm$^2$. Using a ultrasonic flaw detector, the number of internal voids was counted. The number of external voids was counted by visual observation. The number of voids is a sum of voids in or on five samples.

Die Pad Deformation

An epoxy resin composition was transfer molded over a QFP at a temperature of 175° C. and a pressure of 70 kgf/cm$^2$. The package was sectioned to examine whether the die pads were deformed.

Wire Deformation

An epoxy resin composition was transfer molded over a QFP with gold wires of 3 mm long connected at a temperature of 175° C. and a pressure of 70 kgf/cm$^2$. The package was observed by a soft X-ray analyzer to examine whether the gold wires were deformed.

The results are shown in Table 3.

TABLE 3

| | E6 | E7 | E8 | CE4 | CE5 |
|---|---|---|---|---|---|
| Silica | No. 1 | No. 2 | No. 2 | No. 4 | No. 5 |
| Loading | 750 | 750 | 850 | 750 | 750 |
| Spiral flow (cm) | 115 | 118 | 96 | 102 | 98 |
| Gel time (sec.) | 22 | 21 | 24 | 22 | 23 |
| Melt viscosity (poise) | 195 | 98 | 145 | 150 | 180 |
| Internal voids (number) | 0 | 0 | 0 | 8 | 11 |
| External voids (number) | 0 | 0 | 0 | 3 | 2 |
| Die pad deformation | no | no | no | yes | yes |
| Wire deformation | no | no | no | yes | yes |

Although some preferred embodiments have been described, many modifications and variations may be made thereto in the light of the above teachings. It is therefore to be understood that within the scope of the appended claims, the invention may be practiced otherwise than as specifically described.

What is claimed is:

1. An epoxy resin composition comprising an epoxy resin, a curing agent, and an inorganic filler, wherein said inorganic filler has a mean particle size of 5 to 40 μm, obtained by a) removing a fraction of fine particles having a particle size of less than 2 μm from starting inorganic filler particles having a mean particle size of 10 to 50 μm which contains said fine particles and b) adding thereto inorganic particles having a mean particle size of 0.1 to 2 μm and a specific surface area of 3 to 10 m$^2$/g as measured by a nitrogen adsorption BET method.

2. A semiconductor device encapsulated with a cured product of an epoxy resin composition as set forth in claim 1.

3. A composition as in claim 1 wherein said inorganic filler has a specific surface area of 0.5 to 3 m$^2$/g as measured by a nitrogen adsorption BET method.

4. A composition as in claim 1 wherein said starting inorganic filler particles contain 0.5 to 2.5% by weight of said fine particles having a particle size of less than 2 μm and have a specific surface of 0.5 to 4 m$^2$/g as measured by a nitrogen adsorption BET method.

5. A composition as in claim 1 wherein said inorganic particles to be added to the starting inorganic filler particles from which the fraction of said fine particles has been removed are spherical fine particles.

6. A composition as in claim 1 wherein said inorganic filler is one selected from the group consisting of fused silica, crystalline silica, alumina, boron nitride, aluminum nitride, silicon nitride, magnesia, and magnesium silicate.

* * * * *